United States Patent
Iwaki et al.

(10) Patent No.: US 9,742,377 B2
(45) Date of Patent: Aug. 22, 2017

(54) FILTER AND DUPLEXER

(71) Applicant: TAIYO YUDEN CO., LTD., Tokyo (JP)

(72) Inventors: Masafumi Iwaki, Tokyo (JP); Jun Tsutsumi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 103 days.

(21) Appl. No.: 14/693,706

(22) Filed: Apr. 22, 2015

(65) Prior Publication Data

US 2015/0341016 A1  Nov. 26, 2015

(30) Foreign Application Priority Data

May 21, 2014 (JP) ................. 2014-104933

(51) Int. Cl.
*H03H 9/70* (2006.01)
*H03H 9/54* (2006.01)
*H03H 9/205* (2006.01)
*H03H 9/17* (2006.01)
*H03H 9/56* (2006.01)
*H03H 9/58* (2006.01)
*H03H 9/60* (2006.01)

(52) U.S. Cl.
CPC ............. *H03H 9/54* (2013.01); *H03H 9/173* (2013.01); *H03H 9/175* (2013.01); *H03H 9/205* (2013.01); *H03H 9/564* (2013.01); *H03H 9/582* (2013.01); *H03H 9/605* (2013.01); *H03H 9/706* (2013.01)

(58) Field of Classification Search
CPC ........... H03H 9/54; H03H 9/175; H04H 9/173
USPC ........................................... 333/133
See application file for complete search history.

(56) References Cited

U.S. PATENT DOCUMENTS

| | | | |
|---|---|---|---|
| 2007/0080756 A1 | 4/2007 | Aigner et al. | |
| 2012/0313724 A1 | 12/2012 | Tsurunari et al. | |
| 2013/0113576 A1* | 5/2013 | Inoue | H03H 9/6433 333/133 |
| 2013/0147577 A1 | 6/2013 | Nishihara et al. | |
| 2013/0321100 A1* | 12/2013 | Wang | H03H 9/584 333/187 |

FOREIGN PATENT DOCUMENTS

| | | |
|---|---|---|
| CN | 1722614 A | 1/2006 |
| CN | 1945987 A | 4/2007 |
| CN | 102598507 A | 7/2012 |
| CN | 103107794 A | 5/2013 |
| JP | 2013-123184 A | 6/2013 |
| WO | 2013/068652 A1 | 5/2013 |

OTHER PUBLICATIONS

Chinese Office Action dated May 18, 2017, in a counterpart Chinese patent application No. 201510262707.4.

* cited by examiner

*Primary Examiner* — Stephen E Jones
*Assistant Examiner* — Scott S Outten
(74) *Attorney, Agent, or Firm* — Chen Yoshimura LLP

(57) ABSTRACT

A filter includes: one or more series resonators that are connected in series between an input terminal and an output terminal; one or more parallel resonators that are connected in parallel between the input terminal and the output terminal; and a laterally coupled resonator that is connected in parallel with at least one of the one or more series resonators.

14 Claims, 16 Drawing Sheets

FILTER AND DUPLEXER

CROSS-REFERENCE TO RELATED APPLICATION

This application is based upon and claims the benefit of priority of the prior Japanese Patent Application No. 2014-104933, filed on May 21, 2014, the entire contents of which are incorporated herein by reference.

FIELD

A certain aspect of the present invention relates to a filter and a duplexer, and in particular, relates to a filter and a duplexer that have a ladder type filter.

BACKGROUND

Recently, a system for a high frequency communication is being transferred to a modulation method such as a W-CDMA (Wideband Code Division Multiple Access) or an OFDM (Orthogonal Frequency Division Multiplexing) that are capable of performing communication with high speed and large capacity. In the modulation method such as the W-CDMA or the OFDM, a peak electrical power of a transmit signal is larger than that of modulation methods such as a TDMA (Time Division Multiple Access) or a FDM (Frequency Division Multiplexing). Japanese Patent Application Publication No. 2013-123184 discloses a ladder type filter and a duplexer using a piezoelectric thin film resonator.

SUMMARY OF THE INVENTION

According to an aspect of the present invention, there is provided a filter including: one or more series resonators that are connected in series between an input terminal and an output terminal; one or more parallel resonators that are connected in parallel between the input terminal and the output terminal; and a laterally coupled resonator that is connected in parallel with at least one of the one or more series resonators.

According to another aspect of the present invention, there is provided a duplexer including: a transmit filter that is connected between a common terminal and a transmit terminal; and a receive filter that is connected between the common terminal and a receive terminal, wherein at least one of the transmit filter and the receive filter is a filter that comprises: one or more series resonators that are connected in series between the common terminal and at least one of the transmit terminal and the receive terminal; one or more parallel resonators that are connected in parallel between the common terminal and the at least one of the transmit terminal and the receive terminal; and a laterally connected resonator that is connected in parallel with at least one of the one or more series resonators.

According to another aspect of the present invention, there is provided a duplexer including: a transmit filter that is connected between a common terminal and a transmit filter; a receive filter that is connected between the common terminal and a receive filter; and a laterally coupled resonator that is connected between the transmit terminal and the receive terminal in parallel with the transmit filter and the receive filter.

DETAILED DESCRIPTION

For example, when a peak electrical power of a transmit signal becomes large, interference between a transmit signal and another signal or increasing of a noise of another signal is worried because of leakage of the transmit signal to a receive band or another frequency band. Therefore, high attenuation characteristics and/or high isolation characteristics is demanded in a filter or a duplexer.

A ladder type filter is designed so that a resonant frequency of a series resonator is substantially consistent with an anti-resonant frequency of a parallel resonator. The anti-resonant frequency of the series resonator is an attenuation pole of a high frequency side of a pass band. The resonant frequency of the parallel resonator is an attenuation pole of a low frequency side of the pass band. In order that the ladder type filter may have high attenuation characteristics and high isolation characteristics, an inductor may be provided in series between a parallel resonator and a ground, or a capacitance value of a parallel resonator may be larger than a capacitance value of a series resonator. However, there methods have a tradeoff relationship between an insertion loss of a filter and the high attenuation and high isolation characteristics.

And so, it is thought that a laterally coupled resonator is connected in parallel with a ladder type filter. The ladder type filter has capacitive phase characteristics at a frequency out of a pass band. On the other hand, the laterally coupled resonator has an inductive phase in a part of the pass band. The laterally coupled resonator has an inductive phase in a frequency band, in which an attenuation is desired, out of the pass band of the ladder type filter. Thus, a phase of a path passing through the ladder type filter is reverse to a phase of a path passing through the laterally coupled resonator. Therefore, a signal in the frequency band is canceled. The insertion loss is not degraded. And, a high attenuation amount can be achieved.

A description will be given of embodiments with reference to drawings.

[First Embodiment]

Figure 1:
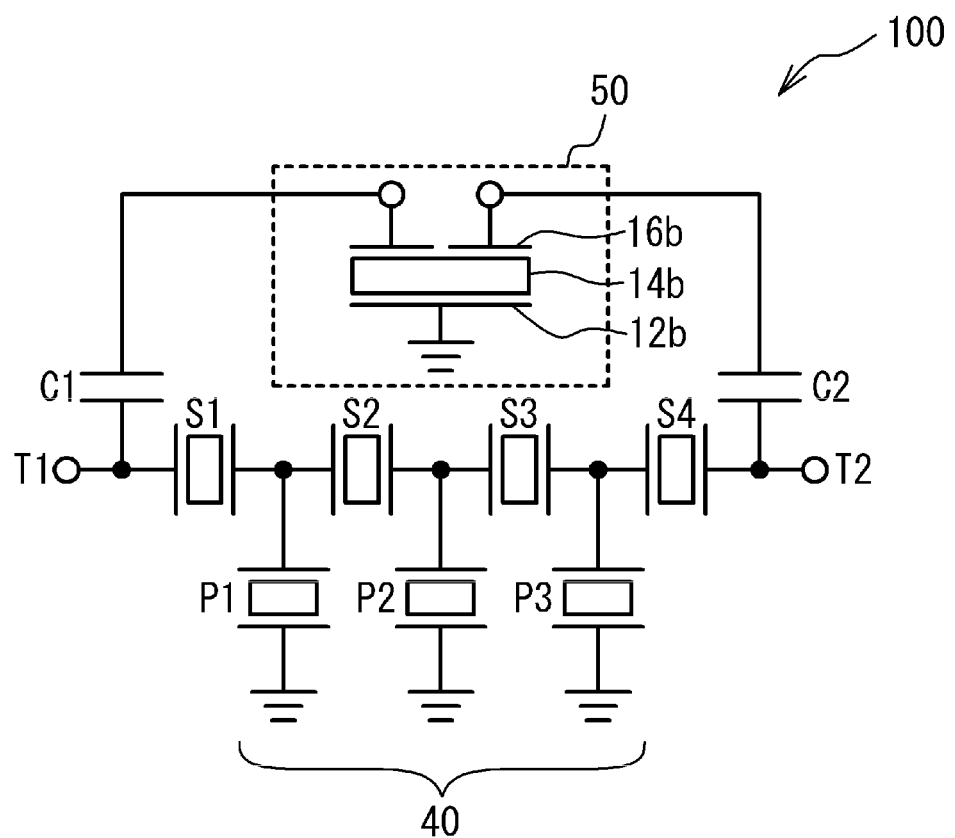
FIG. 1 illustrates a circuit diagram of a filter in accordance with a first embodiment.

FIG. 1 illustrates a circuit diagram of a filter in accordance with a first embodiment. As illustrated in FIG. 1, a filter 100 has a ladder type filter 40 and a laterally coupled resonator 50. The ladder type filter 40 has one or more series resonators S1 to S4 and one or more parallel resonators P1 to P3. The series resonators S1 to S4 are connected in series between an input terminal T2 and an output terminal T1. The parallel resonators P1 to P3 are connected in parallel between the input terminal T2 and the output terminal T1. The series resonators S1 to S4 and the parallel resonators P1 to P3 are a piezoelectric thin film resonator. FIG. 1 illustrates an example of six-stage ladder type filter. However, the number and the connection relationship of the series resonators S1 to S4 and the parallel resonators P1 to P3 can be arbitrarily changed in accordance with a desirable property.

The laterally coupled resonator 50 is connected in parallel with the ladder type filter 40 between the input terminal T2 and the output terminal T1. Capacitors C1 and C2 are connected in series with the laterally coupled resonator 50 between the output terminal T1 and the input terminal T2. The capacitor C1 is connected between the laterally coupled resonator 50 and the output terminal T1. The capacitor C2 is connected between the laterally coupled resonator 50 and the input terminal T2. In the laterally coupled resonator 50, a lower electrode 12b and an upper electrode 16b sandwich a piezoelectric film 14b.

Figure 2:
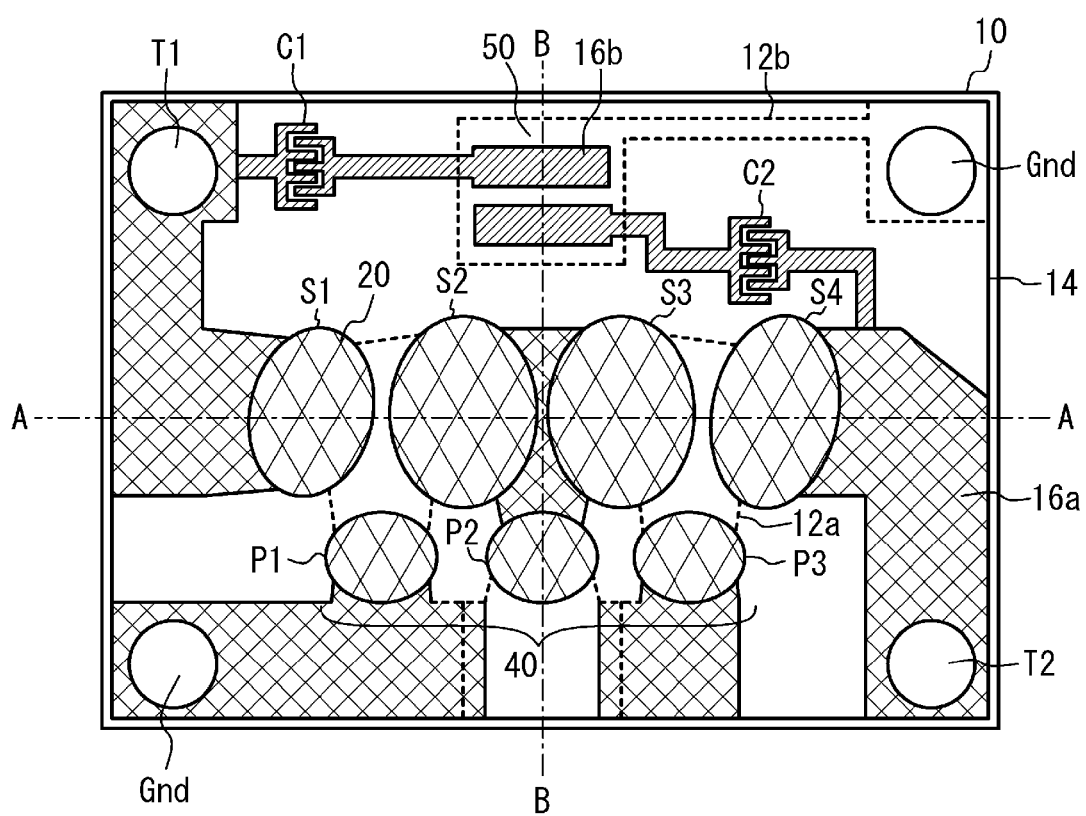
FIG. 2 illustrates a plane view of a chip in which a filter in accordance with a first embodiment is formed.
Figure 3A:
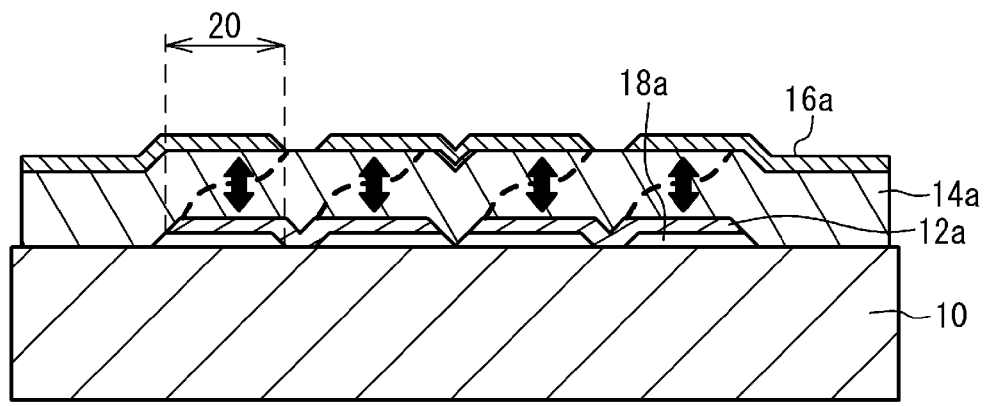
FIG. 3A and FIG. 3B illustrate cross sectional views of a chip in which a filter in accordance with a first embodiment is formed.
Figure 3B:
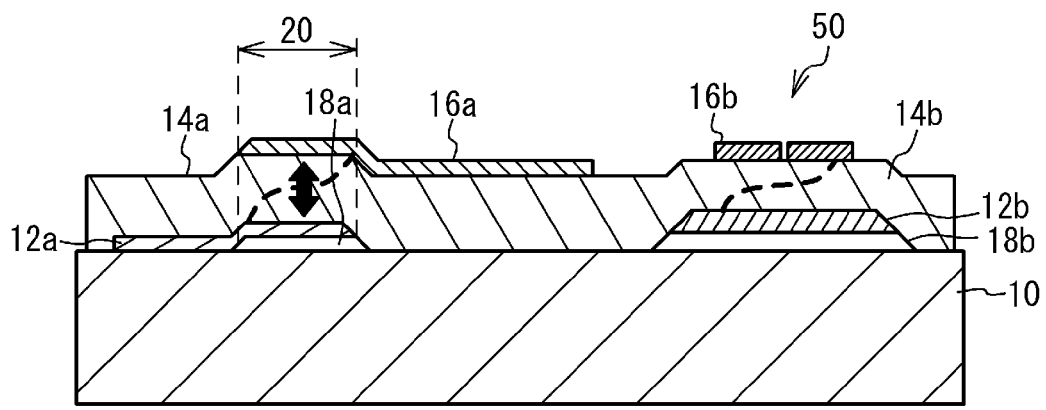

FIG. 2 illustrates a plane view of a chip in which the filter in accordance with the first embodiment is formed. FIG. 3A and FIG. 3B illustrate cross sectional views of the chip in which the filter in accordance with the first embodiment is formed. FIG. 3A illustrates a cross sectional view taken along a line A-A of FIG. 2. FIG. 3B illustrates a cross sectional view taken along a line B-B of FIG. 2. As illustrated in FIG. 2 to FIG. 3B, in the ladder type filter 40, a piezoelectric film 14a is formed on a substrate 10. A lower electrode 12a and an upper electrode 16a sandwich the piezoelectric film 14a. A region where the lower electrode 12a and the upper electrode 16a sandwich the piezoelectric film 14a and face with each other is a resonance region 20. The resonance region 20 has an ellipse shape. An upper face of the substrate 10 is flat. The lower electrode 12a forms a cavity 18a with the substrate 10. The piezoelectric film 14a mainly contributes to a thickness longitudinal oscillation illustrated with a vertical arrow in FIG. 3A. The series resonators S1 to S4 are connected in series between the output terminal T1 and the input terminal T2. The parallel resonators P1 to P3 are connected in parallel between the output terminal T1 and the input terminal T2. First ends of the parallel resonators P1 to P3 are connected to a ground terminal Gnd.

In the laterally coupled resonator 50, the piezoelectric film 14b is formed on the substrate 10. The lower electrode 12b and the upper electrode 16b sandwich the piezoelectric film 14b. Viewed from above, the lower electrode 12b is formed so as to cover two upper electrodes 16b. The upper electrodes 16b face with each other in a lateral direction. One of the upper electrodes 16b is connected to the output terminal T1. The other is connected to the input terminal T2. The lower electrode 12b is connected to the ground terminal Gnd. The capacitors C1 and C2 respectively have comb electrodes facing with each other in the lateral direction. Electrode fingers of a pair of the comb electrodes are alternately arranged. The comb electrode is formed from the upper electrode 16b.

The substrate 10 may be a semiconductor substrate such as a silicon substrate or an insulating substrate such as a glass substrate. A piezoelectric film 14 and the piezoelectric films 14a and 14b may be an aluminum nitride film, a zinc oxide or the like. The lower electrodes 12a and 12b and the upper electrodes 16a and 16b may be a metal film such as ruthenium, chromium, or titanium. The input terminal T2, the output terminal T1 and the ground terminal Gnd may be a bump such as solder or gold.

Figure 4A:
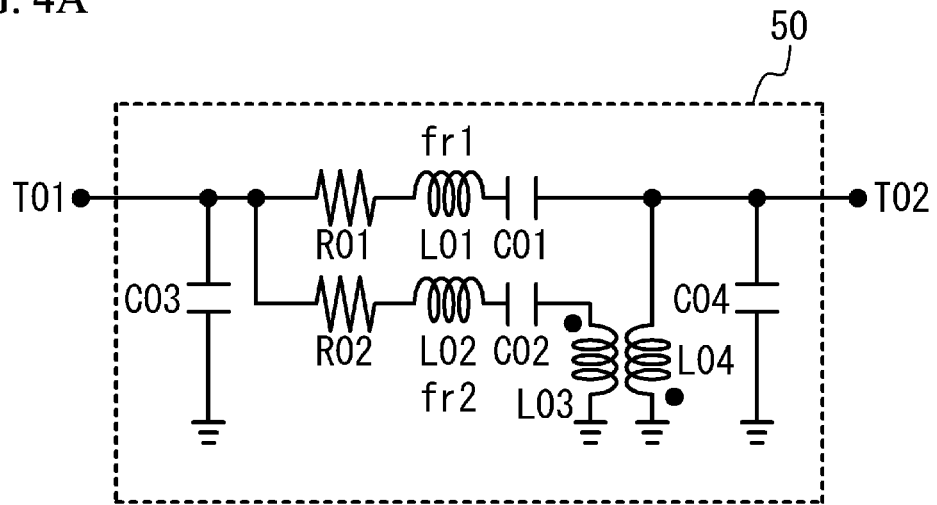
FIG. 4A illustrates an equivalent circuit of a laterally coupled resonator.
Figure 4B:
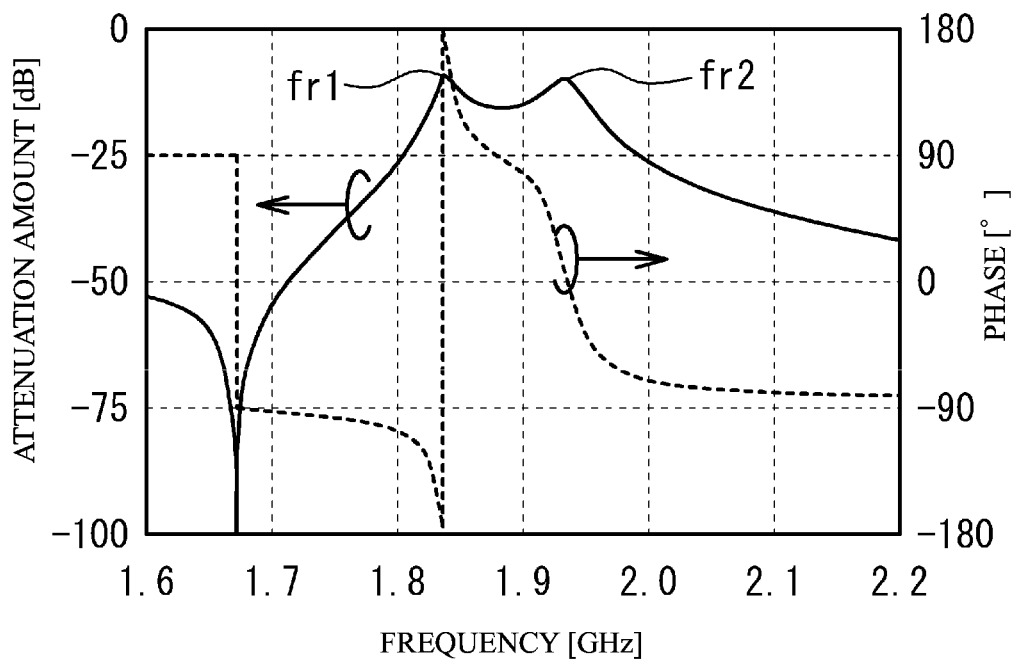
FIG. 4B illustrates an attenuation amount and a phase with respect to a frequency of a laterally coupled resonator.

FIG. 4A illustrates an equivalent circuit of a laterally coupled resonator. FIG. 4B illustrates an attenuation amount and a phase with respect to a frequency of the laterally coupled resonator. As illustrated in FIG. 4A, the equivalent circuit of a laterally coupled resonator 50 has resistors R01 and R02, inductors L01 to L04 and capacitors C01 to C04. The resistor R01, the inductor L01 and the capacitor C01 are connected in series between the terminal T01 and the terminal T02. The resistor R02, the inductor L02, the capacitor C02 and the inductor L03 are connected in series between the terminal T01 and the ground. The inductor L04 is connected between the terminal T02 and the ground. The capacitor C03 is connected between the terminal T01 and the ground. The capacitor C04 is connected between the terminal T02 and the ground. The resistor R01, the inductor L01 and the capacitor C01 are a series resonance circuit having a resonant frequency fr1. The resistor R02, the inductor L02 and the capacitor C02 are a series resonance circuit having a resonant frequency fr2. The resonant frequencies fr1 and the resonant frequency fr2 are different from each other and are slightly spaced from each other. Two series resonance circuits are dielectrically coupled by the inductors L03 and L04.

In FIG. 4B, a solid line indicates an attenuation amount. A broken line indicates a phase. The resonant frequencies fr1 and fr2 are respectively 1.84 GHz and 1.92 GHz. The attenuation amount is locally minimum at the resonant frequencies fr1 and fr2. The phase is inductive of 90 degrees between the resonant frequencies fr1 and fr2. The phase is inductive of 90 degrees at 1.67 GHz or less.

Figure 5A:
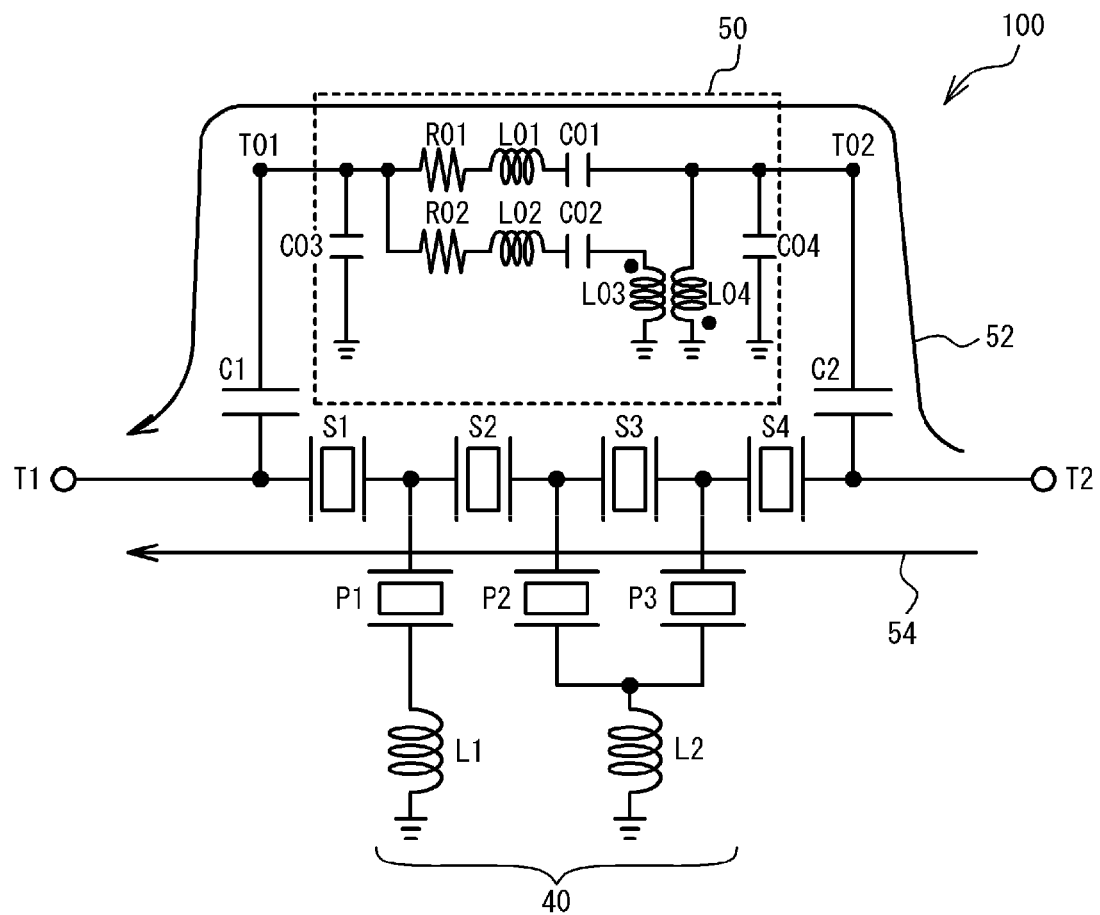
FIG. 5A illustrates a circuit diagram of 1 filter in accordance with a first embodiment used for a simulation.

A simulation was performed with respect to a duplexer that uses the filter of the first embodiment as a receive filter. FIG. 5A illustrates a circuit diagram of the filter of the first embodiment used for the simulation. As illustrated in FIG. 5A, the terminal T01 of the laterally coupled resonator 50 is connected to the terminal T1 via a capacitor C1. The terminal T02 is connected to the terminal T2 via the capacitor C2. The series resonators S1 to S4 and the parallel resonators P1 to P3 of the ladder type filter 40 are a piezoelectric thin film resonator. The inductor L1 is connected between the parallel resonator P1 and the ground. The inductor L2 is connected between the parallel resonators P2 and P3 and the ground. The inductors L1 and L2 enlarge an attenuation amounts on a high frequency side and a low frequency side of the pass band. A path from the terminal T2 to the terminal T1 that passes through the laterally coupled resonator 50 is referred to as a path 52. A path from the terminal T2 to the terminal T1 that passes through the ladder type filter 40 is referred to as a path 54.

In FIG. 2 to FIG. 3B, the piezoelectric films 14a and 14b are an aluminum nitride film. The lower electrodes 12a and 12b and the upper electrodes 16a and 16b are a lamination film of a ruthenium film and a chromium film.

Figure 5B:
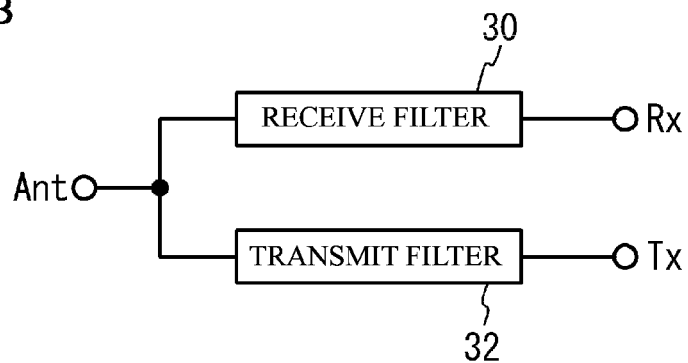
FIG. 5B illustrates a circuit diagram of a duplexer.

FIG. 5B illustrates a circuit diagram of a duplexer. A receive filter 30 is connected between a common terminal Ant and a receive terminal Rx. A transmit filter 32 is connected between the common terminal Ant and a transmit terminal Tx. The receive filter 30 is the filter 100 of the first embodiment.

Figure 6A:
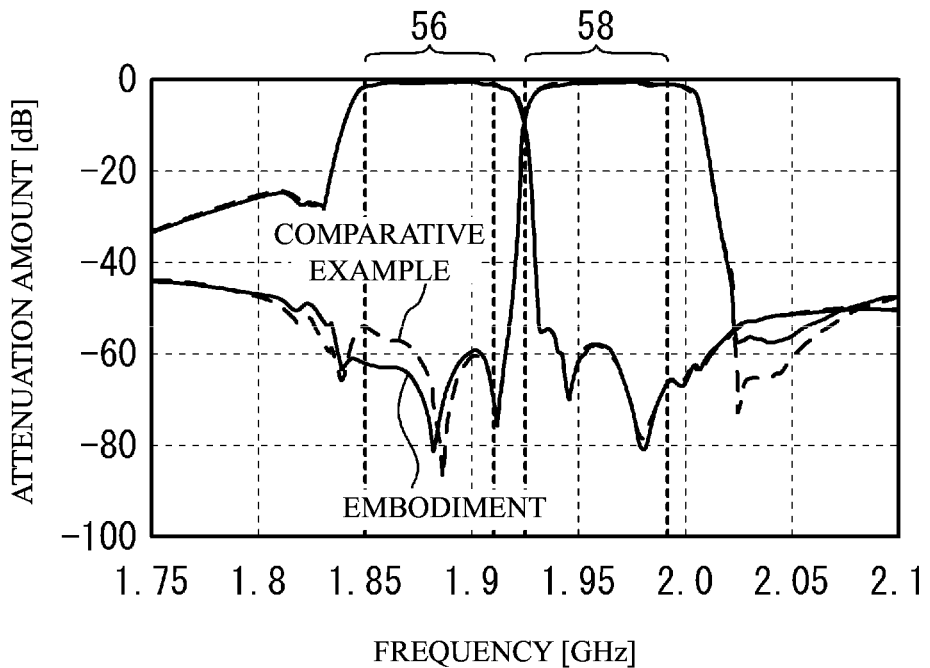
FIG. 6A illustrates pass characteristics.
Figure 6B:
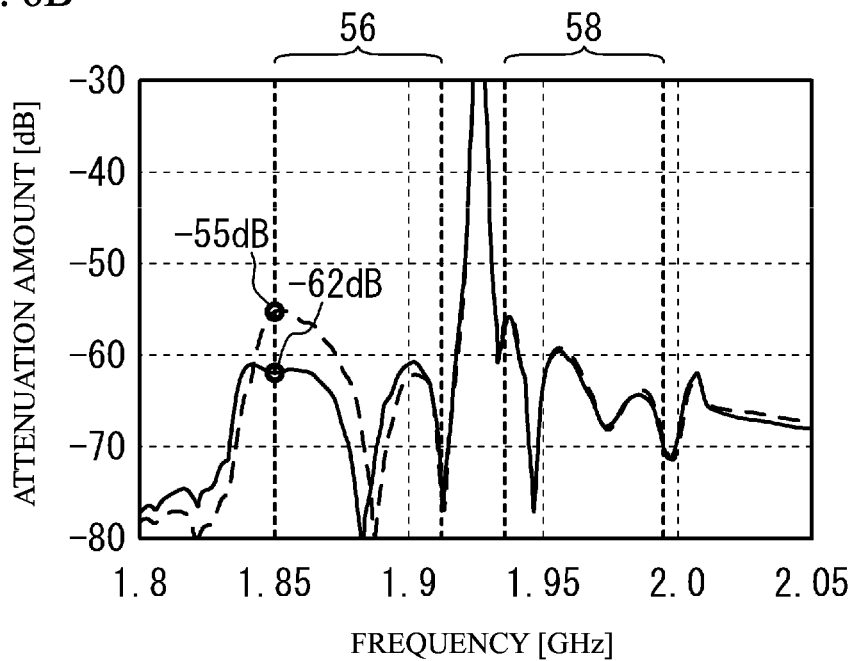
FIG. 6B illustrates isolation characteristics.

FIG. 6A illustrates pass characteristics. FIG. 6B illustrates isolation characteristics. FIG. 6A illustrates pass characteristics from the transmit terminal Tx to the common terminal Ant and pass characteristics from the common terminal Ant to the receive terminal Rx. FIG. 6B illustrates isolation characteristics from the transmit terminal Tx to the receive terminal Rx. "56" indicates the transmit band. "58" indicates the receive band. A solid line indicates characteristics in a case where the filter of the first embodiment is used as the receive filter 30. A broken line indicates characteristics in a case where the filter of the first comparative example that does not have the laterally coupled resonator 50 is used as the receive filter 30.

As illustrated in FIG. 6A, in the first embodiment, the attenuation amount of the receive filter 30 in a transmit band 56 is improved, compared to the first comparative example. As illustrated in FIG. 6B, the worst isolation in the transmit band 56 is −55 dB in the first comparative example. In contrast, the worst isolation is improved to −62 dB by 7 dB in the first embodiment.

Figure 7A:
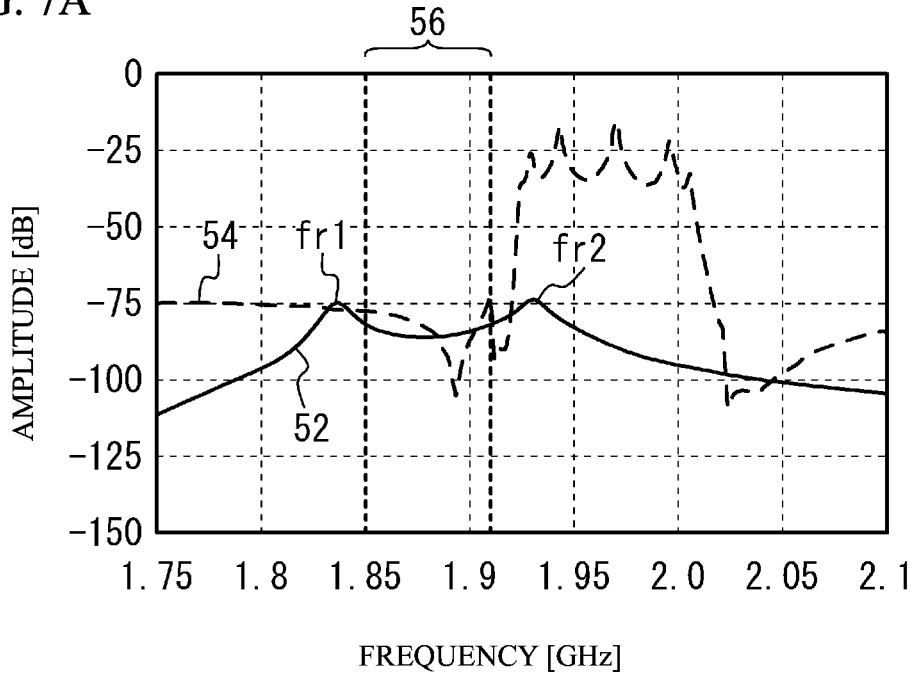
FIG. 7A and FIG. 7B illustrate amplitude and a phase of a current passing through paths 52 and 54 of a first embodiment with respect to a frequency.
Figure 7B:
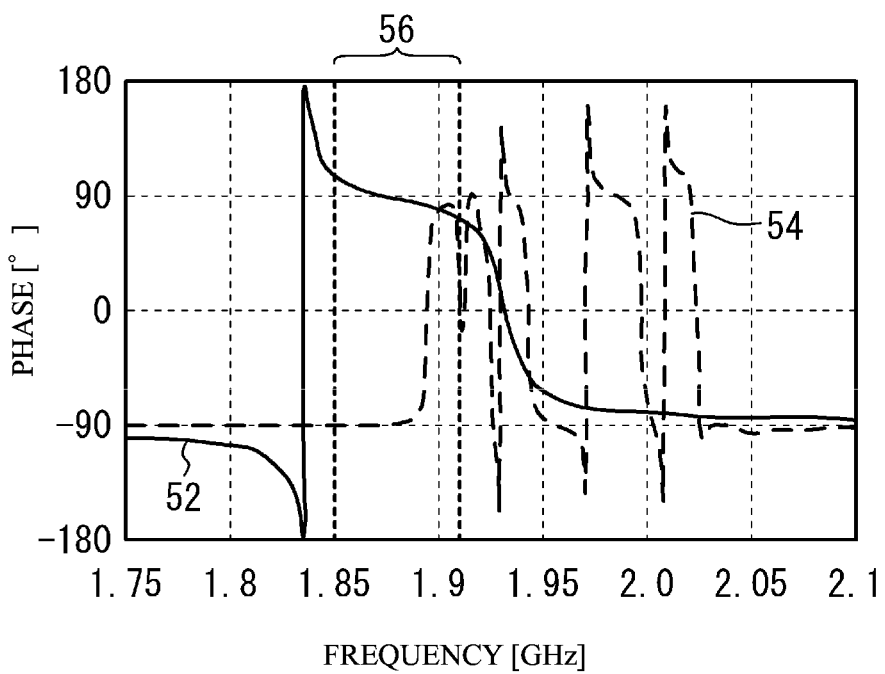

FIG. 7A and FIG. 7B illustrate amplitude and a phase of a current passing through the paths 52 and 54 of the first embodiment with respect to a frequency. Amplitude |Y| and a phase angle ∠Y are indicated with admittance Y characteristics. As illustrated in FIG. 7A, in the transmit band 56, the amplitude of the path 52 is substantially the same as the amplitude of the path 54. When capacitance values of the capacitors C1 and C2 are adequately selected, the amplitude of the path 52 can be substantially the same as the amplitude of the path 54. The capacitance values of the capacitors C1 and C2 are 0.3 pF or the like. As illustrated in FIG. 7B, in the transmit band 56, the phase of the path 52 is substantially reverse to the phase of the path 54. In this manner, the resonant frequencies fr1 and fr2 of the laterally coupled resonator 50 are located on both sides of the transmit band 56. Thus, the phase of the laterally coupled resonator 50 in the transmit band 56 is inductive. On the other hand, the transmit band 56 is out of the pass band of the ladder type filter 40. Therefore, the phase is capacitive. In this manner, the phase of the path 52 is substantially reverse to the phase of the path 54.

In the first embodiment, as illustrated in FIG. 1, the laterally coupled resonator 50 is connected between the input terminal T2 and the output terminal T1 in parallel with the series resonators S1 to S4. As illustrated in FIG. 7B, the phase of the path 52 can be substantially reverse to the phase of the path 54 in an arbitrary frequency band in which the phase of the laterally coupled resonator 50 out of the pass band of the ladder type filter 40 is inductive. Therefore, a large attenuation amount can be achieved without degradation of the insertion loss. The laterally coupled resonator 50 has to be connected in parallel with at least one of the series resonators S1 to S4.

As illustrated in FIG. 2 to FIG. 3B, the laterally coupled resonator 50 has the piezoelectric film 14b (a first piezoelectric film), the lower electrode 12b (a first lower electrode) and a plurality of upper electrodes 16b (first upper electrodes). The lower electrode 12b and the upper electrodes 16b sandwich the piezoelectric film 14b. Thus, the laterally coupled resonator having the equivalent circuit of FIG. 4A can be achieved.

The series resonators S1 to S4 and the parallel resonators P1 to P3 are a piezoelectric thin film resonator that has the piezoelectric film 14a (a second piezoelectric film), the lower electrode 12a (a second lower electrode) and the upper electrode 16a (a second upper electrode). The lower electrode 12a and the upper electrode 16a sandwich the piezoelectric film 14a. The piezoelectric film 14 is used as the piezoelectric film 14a and the piezoelectric film 14b. That is, the piezoelectric films 14a and 14b are made of an identical material and have an identical thickness. Thus, it is possible to manufacture the piezoelectric film 14a that mainly contributes to a thickness longitudinal oscillation of the series resonators S1 to S4 and the parallel resonators P1 to P3 and the piezoelectric film 14b that mainly contributes to the oscillation of the laterally coupled resonator 50 in a single manufacturing process. It is therefore possible to reduce the number of manufacturing processes.

Moreover, the lower electrodes 12a and 12b are made of an identical material and have an identical thickness. The upper electrodes 16a and 16b are made of an identical material and have an identical thickness. It is therefore possible to reduce the number of manufacturing process of the filter 100.

Moreover, the capacitors C1 and C2 are connected to the laterally coupled resonator 50 in series in parallel with the series resonators S1 to S4. Thus, when the capacitance values of the capacitors C1 and C2 are adequately set, the amplitude of the signal passing through the path 52 can be substantially the same as the amplitude of the signal passing through the path 54. It is preferable that the capacitance values of the capacitors C1 and C2 are small such that impedance of the path 52 is substantially the same as impedance of the laterally coupled resonator 50. Only one of the capacitors C1 and C2 may be provided.

In this manner, in a suppression band in which suppression of a signal is desired, the amplitude of the signal passing through the path 52 is substantially the same as the amplitude of the signal passing through the path 54, and the phase of the signal passing through the path 52 is substantially reverse to the phase of the signal passing through the path 54. Thus, in an arbitrary suppression band, the attenuation amount can be improved. For example, it is preferable that the amplitude of the signal passing through the path 52 is consistent with the amplitude of the signal passing through the path 54 in a plus-minus 50% range. It is more preferable that the amplitude of the signal passing through the path 52 is consistent with the amplitude of the signal passing through the path 54 in a plus-minus 20% range. The phase of the signal passing through the path 52 is reverse to the phase of the signal passing through the path 54 in a plus-minus 89 degrees range. It is preferable that the phase of the signal passing through the path 52 is reverse to the phase of the signal passing through the path 54 in a plus-minus 20 degrees range.

The capacitors C1 and C2 are provided on the output terminal T1 side and the input terminal T2 side of the laterally coupled resonator 50. With the structure, it is easy to achieve impedance matching when connecting the ladder type filter 40 to the laterally coupled resonator 50.

As illustrated in FIG. 5B, one of the receive filter 30 and the transmit filter 32 of the duplexer can be used as the filter of the first embodiment. In this case, the resonant frequency of the laterally coupled resonator 50 is a frequency such that the phase of the pass band of an opposing filter of the laterally coupled resonator 50 is inductive. The opposing filter is one of the transmit filter 32 and the receive filter 30. Thus, in the pass band of the opposing filter, the phase of the path 52 can be reverse to the phase of the path 54. Therefore, high isolation characteristics can be achieved.

Figure 8A:
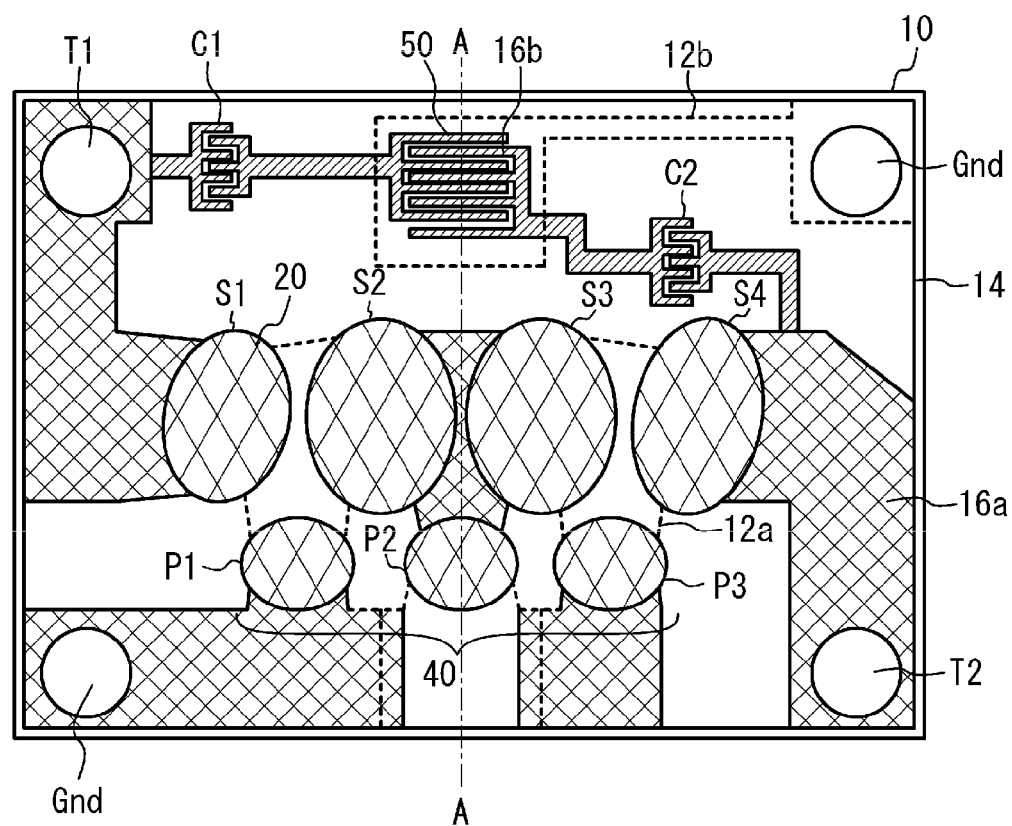
FIG. 8A illustrates a plane view of a filter in accordance with a first modified embodiment of a first embodiment.
Figure 8B:
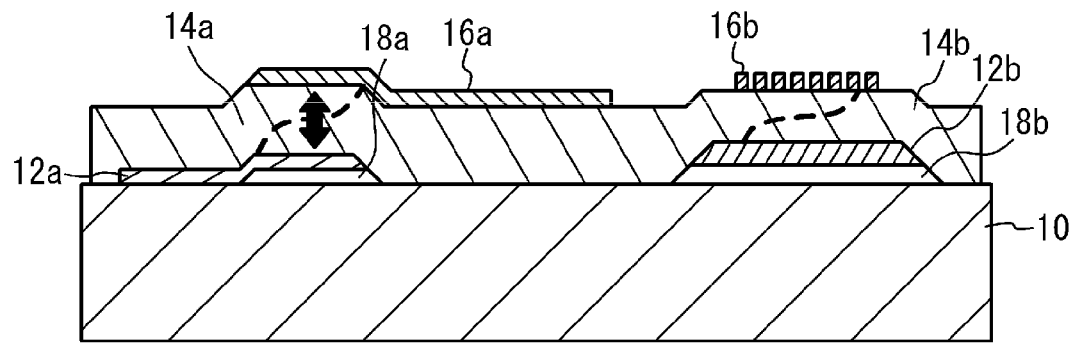
FIG. 8B illustrates a cross sectional view taken along a line A-A.

FIG. 8A illustrates a plane view of a filter in accordance with a first modified embodiment of the first embodiment. FIG. 8B illustrates a cross sectional view taken along a line A-A. As illustrated in FIG. 8A and FIG. 8B, the upper electrode 16b of the laterally coupled resonator 50 is a comb electrode. A pair of electrode fingers of the comb electrode are alternately provided. Other structures are the same as the first embodiment. Therefore, an explanation of the structures is omitted.

In the first modified embodiment of the first embodiment, the plurality of upper electrodes 16b are comb electrodes facing each other. With the structure, an efficient location of the upper electrodes 16b is possible, and a chip area can be reduced.

Figure 9:
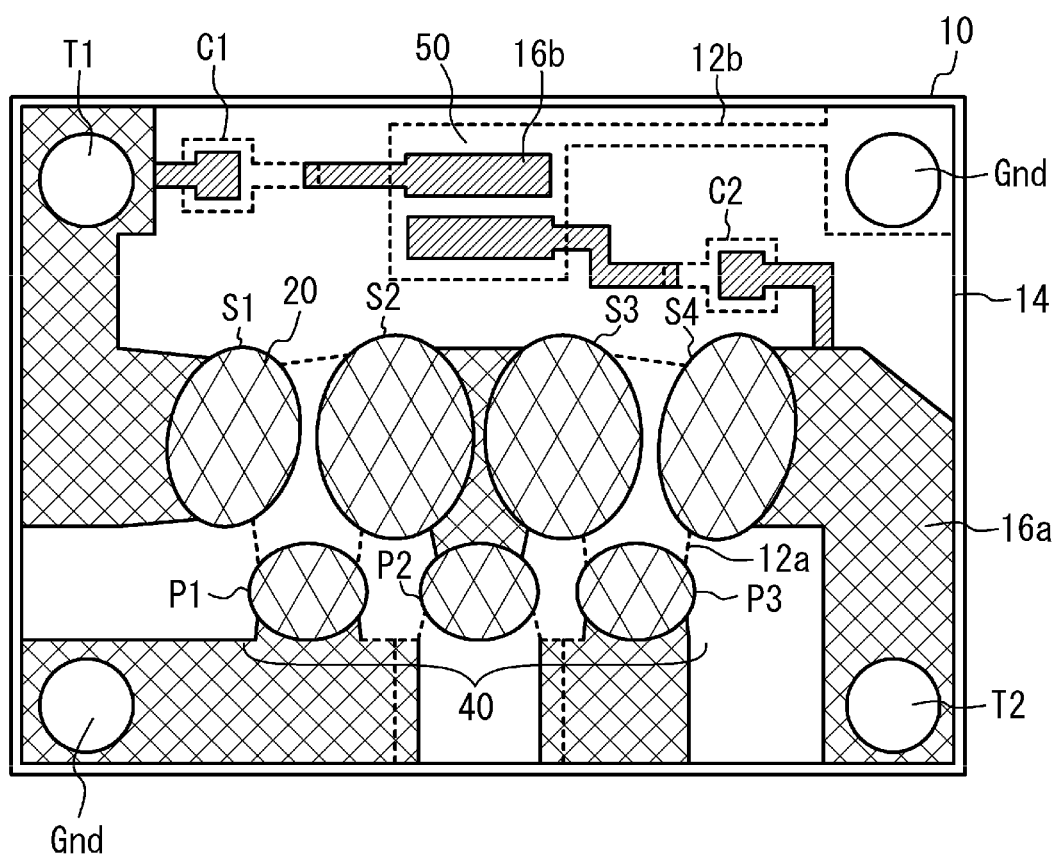
FIG. 9 illustrate a plane view a filter in accordance with a second modified embodiment of a first embodiment.
Figure 10:
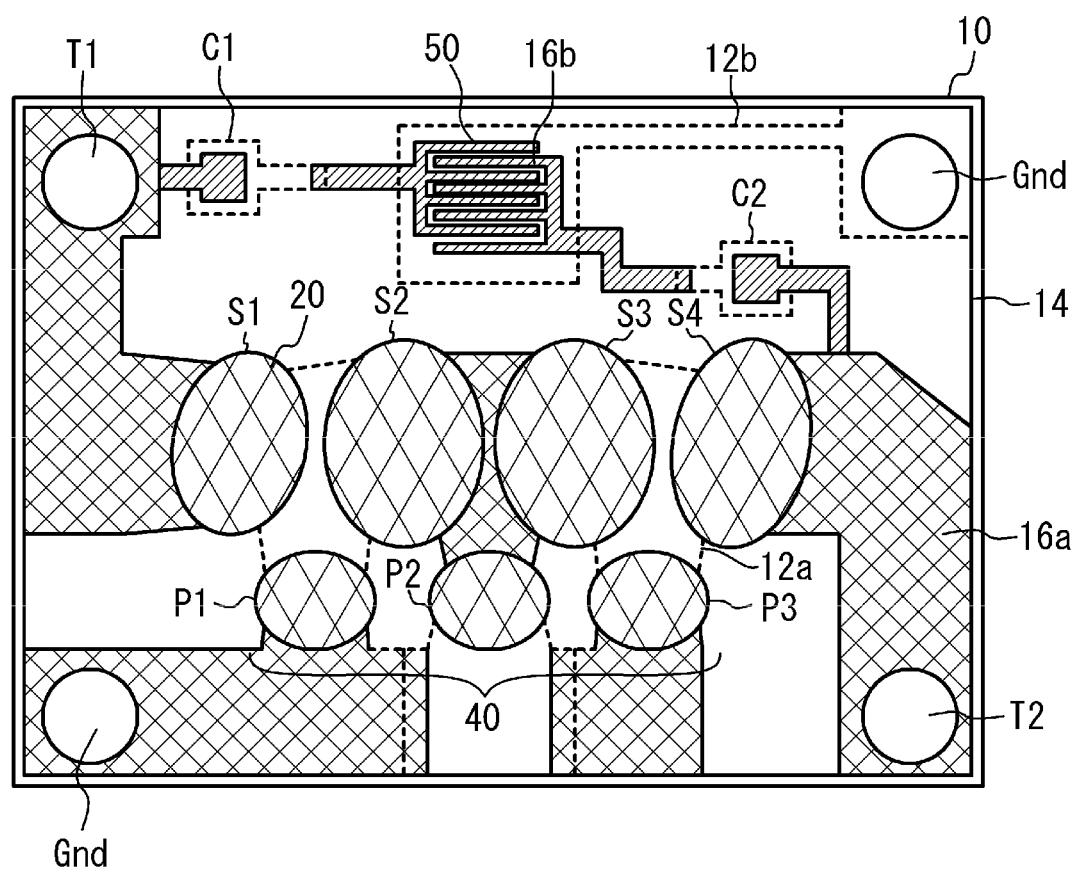
FIG. 10 illustrate a plane view a filter in accordance with a second modified embodiment of a first embodiment.

FIG. 9 and FIG. 10 illustrate plane views of a filter in accordance with a second modified embodiment of the first embodiment. As illustrated in FIG. 9 and FIG. 10, the capacitors C1 and C2 are a MIM (Metal Insulator Metal) capacitor in which the lower electrode 12b and the upper electrode 16b sandwich the piezoelectric film 14. Other structures are the same as the first embodiment and the first modified embodiment. Therefore, an explanation of the structures is omitted.

As in the case of the second modified embodiment of the first embodiment, the MIM capacitor can be used as the capacitors.

Figure 11:
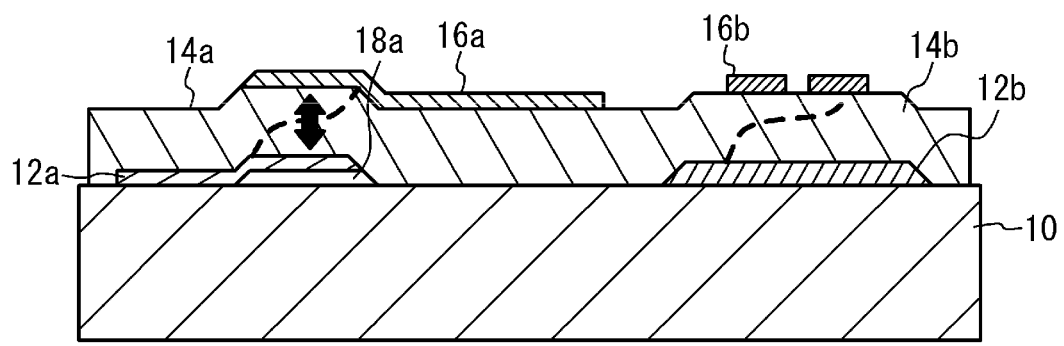
FIG. 11 illustrates a cross sectional view of a filter in accordance with a third modified embodiment of a first embodiment.

FIG. 11 illustrates a cross sectional view of a filter in accordance with a third modified embodiment of the first embodiment. As illustrated in FIG. 11, no gap is provided between the lower electrode 12b and the substrate 10 of the laterally coupled resonator 50. Other structures are the same as the first embodiment. Therefore, an explanation of the structures is omitted.

Figure 12A:
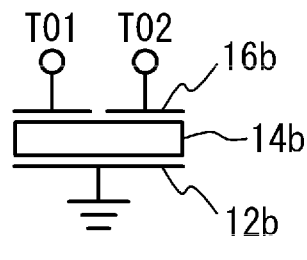
FIG. 12A to FIG. 12F illustrate examples of a laterally connected resonator.
Figure 12B:
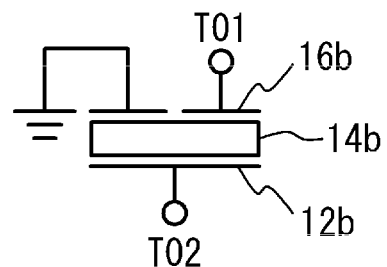
Figure 12C:
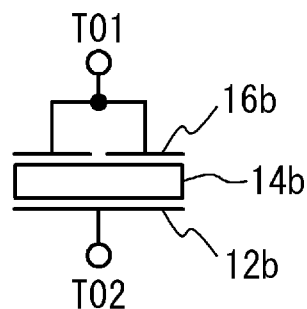
Figure 12D:
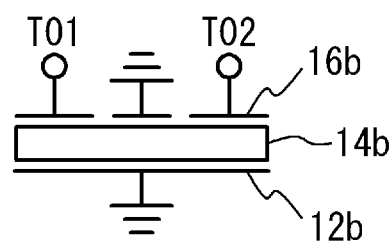
Figure 12E:
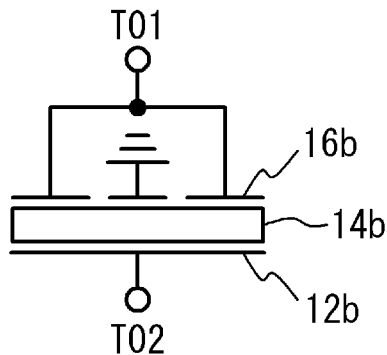
Figure 12F:
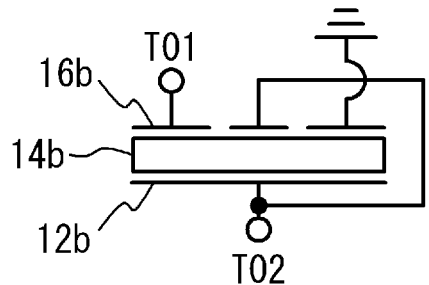

FIG. 12A to FIG. 12F illustrate examples of the laterally coupled resonator. FIG. 12A to FIG. 12C illustrate examples of a bipolar type resonator having two upper electrodes 16b. FIG. 12D to FIG. 12F illustrate examples of a three-pole type resonator having three upper electrodes 16b. FIG. 12A illustrates the laterally coupled resonator used for the first embodiment. As illustrated in FIG. 12B, the lower electrode 12b may be connected to the terminal T02, and one of the upper electrodes 16b may be connected to the terminal T01 and the other may be connected to the ground. As illustrated in FIG. 12C, the lower electrode 12b may be connected to the terminal T02, and the upper electrodes 16b may be connected to the terminal T01 in common. As illustrated in FIG. 12D, the lower electrode 12b may be connected to the ground, the upper electrodes 16b of the both sides may be connected to the terminals T01 and T02, and a middle of the upper electrodes 16b may be connected to the ground. As illustrated in FIG. 12E, the lower electrode 12b may be connected to the terminal T02, the upper electrodes 16b of the both sides may be connected to the terminal T01 in common, and a middle of the upper electrodes 16b may be connected to the ground. As illustrated in FIG. 12F, the lower electrode 12b and a middle of the upper electrodes 16b may be connected to the terminal T02 in common, one of the upper electrodes 16b may be connected to the terminal T01, and the other may be connected to the ground.

A structure of the bipolar resonator is simple. Therefore, a chip area can be reduced. The three-pole resonator can form three poles in the communication band and can achieve various electrical characteristics. A resonator of which number of pole is four or more can be used as the laterally coupled resonator 50. These resonators may be connected in series and/or in parallel. The laterally coupled resonators of FIG. 12A to FIG. 12F can be used for the first embodiment and the modified embodiments.

Figure 13A:
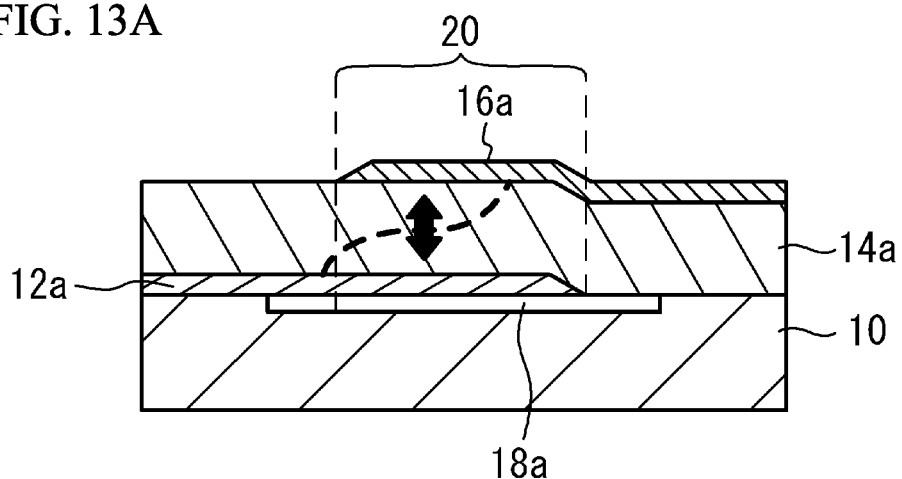
FIG. 13A and FIG. 13B illustrate examples of a piezoelectric thin film resonator.
Figure 13B:
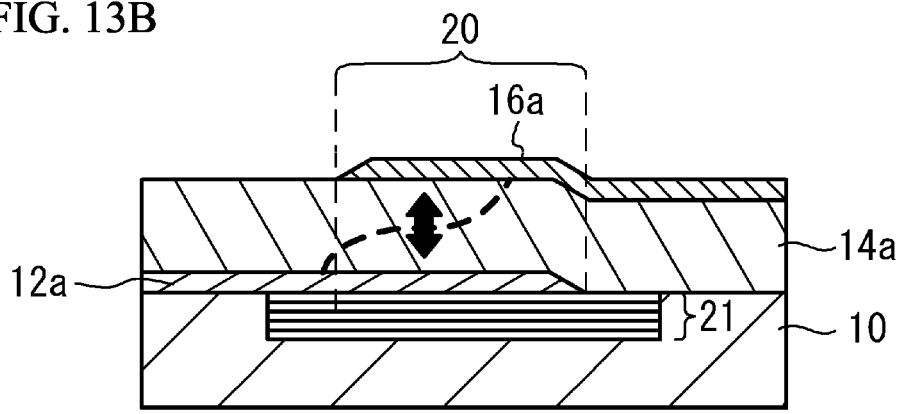

FIG. 13A and FIG. 13B illustrate examples of the piezoelectric thin film resonator. As illustrated in FIG. 13A, a recess is formed on an upper face of the substrate 10, and the lower electrode 12a has a flat surface. Thus, the cavity 18a is formed in the recess of the substrate 10. The cavity 18a includes a part of the resonance region 20. Other structures are the same as the first embodiment. Therefore, an explanation of the structures is omitted. The cavity 18a may penetrate the substrate 10. An insulating film may be formed on a lower face of the lower electrode 12a. Other structures are the same as the piezoelectric thin film resonator of FIG. 3A. Therefore, an explanation of the structures is omitted.

As illustrated in FIG. 13b, a sound reflecting film 21 is formed in the substrate 10 in the resonance region 20. The sound reflecting film 21 has a structure in which a film having low acoustic impedance and a film having high acoustic impedance are alternately provided. A thickness of each film is approximately $\lambda/4$ ($\lambda$ is a wavelength of an acoustic wave). Thus, the sound reflecting film 21 acts as a distributed Bragg reflector. Other structures are the same as the piezoelectric thin film resonator of FIG. 3A. Therefore, an explanation of the structures is omitted.

As illustrated in FIG. 3A and FIG. 13A, the piezoelectric thin film resonator may be a FBAR (Film Bulk Acoustic Resonator) in which the cavity 18a is formed between the substrate 10 and the lower electrode 12a in the resonance region 20. As illustrated in FIG. 13B, the piezoelectric thin film resonator may be an SMR (Solidly Mounted Resonator) that has the sound reflecting film 21 that reflects an acoustic wave propagating in the piezoelectric film 14a, under the lower electrode 12a in the resonance region 20. A description is given of the case where the resonance region 20 has an ellipse shape. However, the resonance region 20 may have another shape. For example, the resonance region 20 may have a polygonal shape such as a tetragonal shape or a pentagonal shape.

[Second Embodiment]

Figure 14:
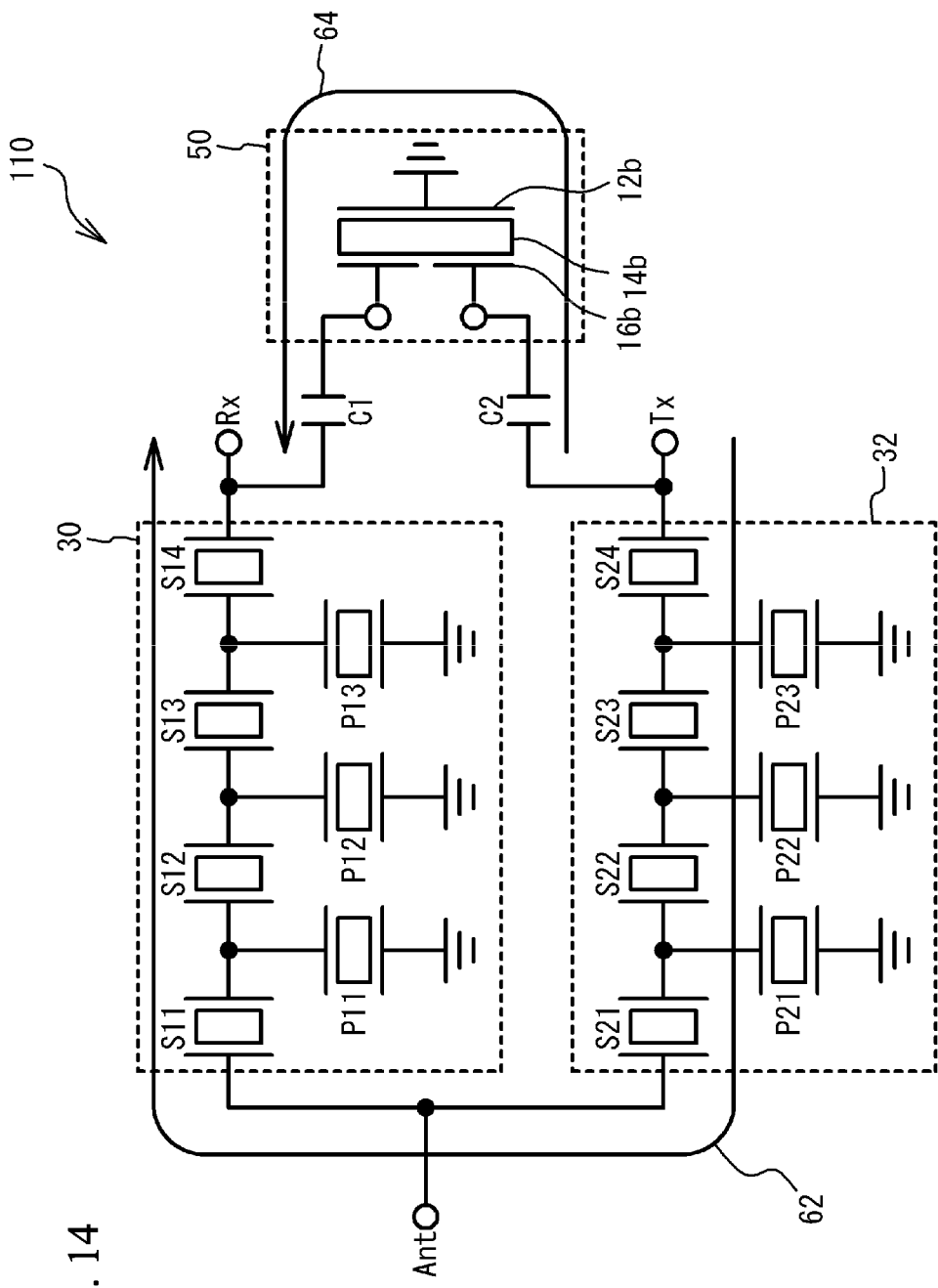
FIG. 14 illustrates a circuit diagram of a duplexer in accordance with a second embodiment.

A second embodiment is an example of a duplexer using the filter of the first embodiment. FIG. 14 illustrates a circuit diagram of a duplexer in accordance with the second embodiment. As illustrated in FIG. 14, a duplexer 110 has the receive filter 30, the transmit filter 32 and the laterally coupled resonator 50. The receive filter 30 and the transmit filter 32 are a ladder type filter. The receive filter 30 has the series resonators S11 to S14 and the parallel resonators P11 to P13. The transmit filter 32 has series resonators S21 to S24 and parallel resonators P21 to P23. The laterally coupled resonator 50 is connected between a receive terminal Rx and a transmit terminal Tx.

Figure 15:
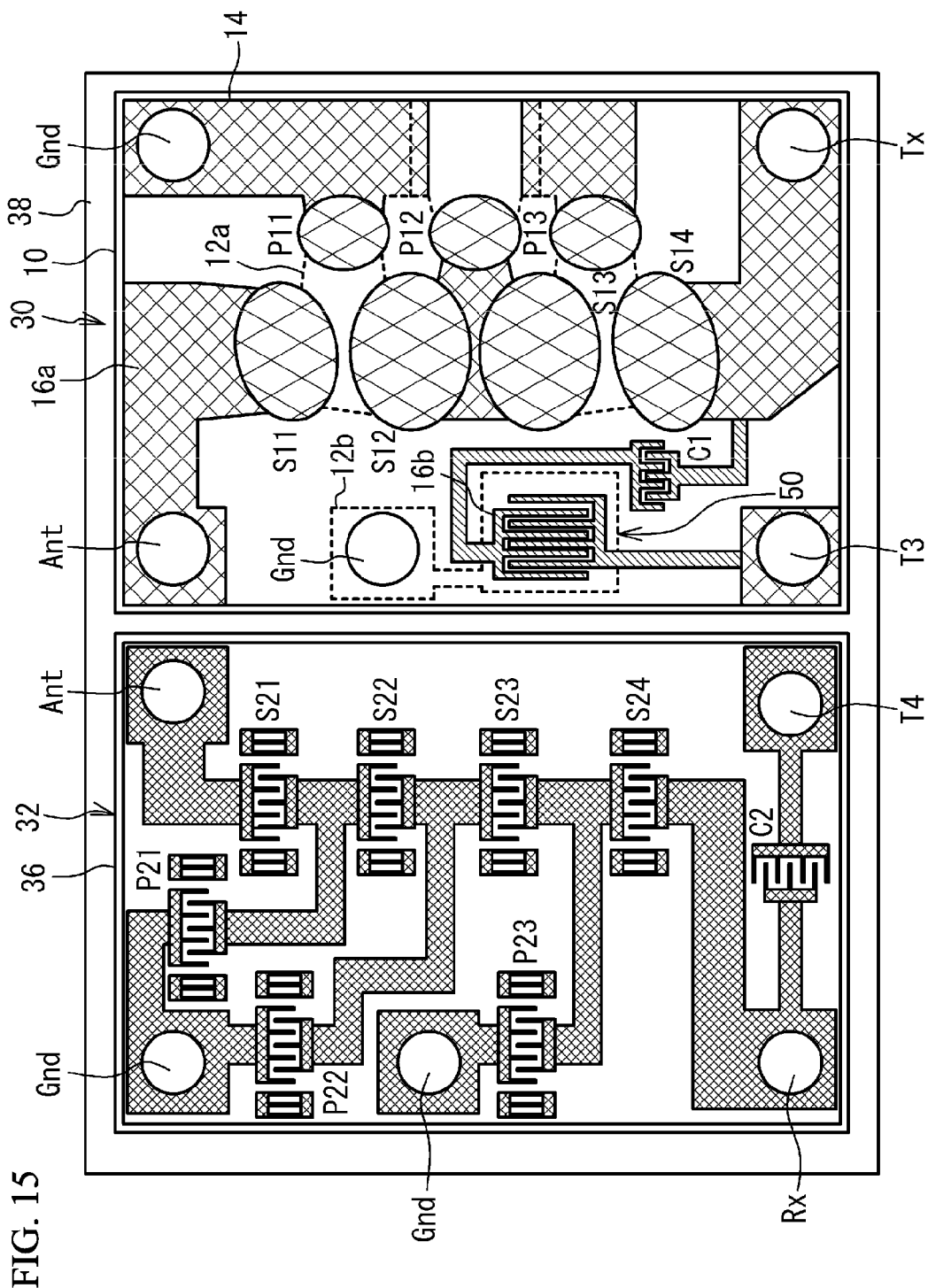
FIG. 15 illustrates a plane view of a duplexer in accordance with a second embodiment.

FIG. 15 illustrates a plane view of a duplexer in accordance with the second embodiment. As illustrated in FIG. 15, the receive filter 30 is formed on the substrate 10. The series resonators S11 to S14 and the parallel resonators P11 to P13 are a piezoelectric thin film resonator formed on the substrate 10. The laterally coupled resonator 50 and the capacitor C1 are formed on the substrate 10. The transmit filter 32 is formed on a substrate 36. The substrate 36 is a piezoelectric substrate such as a lithium tantalate substrate or a lithium niobate substrate. The series resonators S21 to S24 and the parallel resonators P21 to P23 are a surface acoustic wave resonator formed on the substrate 36. The common terminal Ant, the transmit terminal Tx, the receive terminal Rx, the connection terminals T3 and T4 and the ground terminal Gnd are a bump formed on the substrate 10 or the substrate 36 or the like. The substrate 10 and the substrate 36 are mounted on a package 38.

In the second embodiment, the laterally coupled resonator 50 is connected between the transmit terminal Tx and the receive terminal Rx in parallel with the transmit filter 32 and the receive filter 30. Amplitude of a signal in a desirable frequency band in a path 62 that passes through the transmit filter 32 and the receive filter 30 from the transmit terminal Tx to the receive terminal Rx is substantially the same as amplitude of a signal in the desirable frequency band in a path 64 that passes through the capacitor C2, the laterally coupled resonator 50 and the capacitor C1 from the transmit terminal Tx to the receive terminal Rx. A phase of the signal of the path 62 is substantially reverse to a phase of the signal of the path 64. Thus, the isolation characteristics from the transmit terminal Tx to the receive terminal Rx can be improved.

It is preferable that at least one of the transmit filter 32 and the receive filter 30 includes a piezoelectric thin film resonator, the piezoelectric film 14b of the laterally coupled resonator 50 is made of the same material of the piezoelectric film 14a of the piezoelectric thin film resonator, and the piezoelectric film 14b has the same thickness as the piezoelectric film 14a. With the structure, the manufacturing process for forming the piezoelectric film 14 can be simplified.

Figure 16:
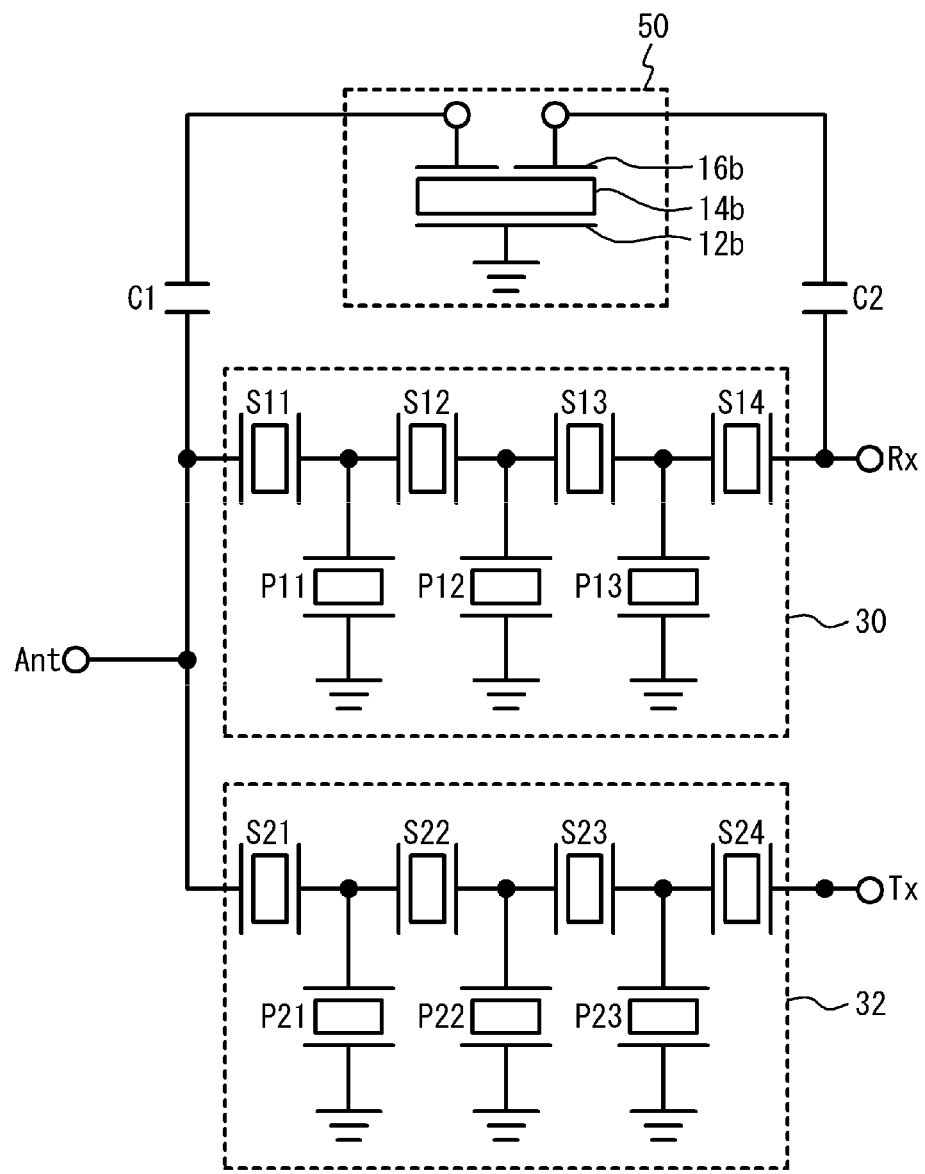
FIG. 16 illustrates a circuit diagram of a duplexer in accordance with a first modified embodiment of a second embodiment.

FIG. 16 illustrates a circuit diagram of a duplexer in accordance with a first modified embodiment of the second embodiment. The laterally coupled resonator 50 is connected in parallel with the receive filter 30. Other structures are the same as the second embodiment. Therefore, an explanation of the structures is omitted.

As in the case of the first modified embodiment of the second embodiment, at least one of the transmit filter 32 and the receive filter 30 may be the filter of the first embodiment or the filter of the modified embodiments of the first embodiment.

In the second embodiment and the modified embodiments, one of the transmit filter 32 and the receive filter 30 may be a multi-mode type filter.

A description is given of the example in which a piezoelectric thin film resonator is used as the resonator of the ladder type filter 40. However, the resonator may be a surface acoustic wave resonator, an interface acoustic wave resonator or a love wave resonator.

The present invention is not limited to the specifically described embodiments, but other embodiments and variations may be made without departing from the scope of the claimed invention.

What is claimed is:

1. A filter comprising:
  a single substrate;
  one or more series resonators that are connected in series between an input terminal and an output terminal;
  one or more parallel resonators that are connected in parallel between the input terminal and the output terminal; and
  a laterally coupled resonator that is connected in parallel with at least one of the one or more series resonators, wherein:
    the laterally coupled resonator has a first piezoelectric film portion, a first lower electrode and a plurality of upper electrodes, the first lower electrode and the plurality of upper electrodes sandwiching the first piezoelectric film portion;
    each of the one or more series resonators and the one or more parallel resonators is a piezoelectric thin film resonator that has a second piezoelectric film portion, a second lower electrode and a second upper electrode, the second lower electrode and the second upper electrode sandwiching the second piezoelectric film portion;
    a material of the first piezoelectric film portion is the same as a material of the second piezoelectric film portion;
    a thickness of the first piezoelectric film portion is substantially the same as a thickness of the second piezoelectric film portion; and
    the one or more series resonators, the one or more parallel resonators and the laterally coupled resonator are formed on the single substrate.

2. The filter as claimed in claim 1, wherein the plurality of upper electrodes are comb electrodes that face each other.

3. The filter as claimed in claim 1 further comprising a capacitor that is connected to the at least one of the series resonators in parallel and is connected to the laterally coupled resonator in series.

4. The filter as claimed in claim 1, further comprising:
  a first capacitor that is connected between the input terminal and the laterally coupled resonator in series with the laterally coupled resonator; and
  a second capacitor that is connected between the laterally coupled resonator and the output terminal in series with the laterally coupled resonator.

5. The filter as claimed in claim 1, wherein:
  an amplitude of a first signal that passes through the at least one of the series resonators is substantially consistent with an amplitude of a second signal that passes through the laterally coupled resonator; and
  a phase of the first signal is substantially reverse to a phase of the second signal.

6. The filter as claimed in claim 1,
wherein:
  a material of the first lower electrode is the same as a material of the second lower electrode;
  a thickness of the first lower electrode is substantially the same as a thickness of the second lower electrode;
  a material of the plurality of first upper electrodes is the same as a material of the second upper electrode;
  a thickness of the plurality of first upper electrodes is substantially the same as a thickness of the second upper electrode.

7. The filter as claimed in claim 1, wherein the first piezoelectric film portion and the second piezoelectric film portion form a single piezoelectric film.

8. A duplexer comprising:
  a transmit filter that is connected between a common terminal and a transmit terminal; and
  a receive filter that is connected between the common terminal and a receive terminal,
  wherein at least one of the transmit filter and the receive filter is a filter that comprises:
    a single substrate;
    one or more series resonators that are connected in series between the common terminal and at least one of the transmit terminal and the receive terminal;

one or more parallel resonators that are connected in parallel between the common terminal and the at least one of the transmit terminal and the receive terminal; and a laterally connected resonator that is connected in parallel with at least one of the one or more series resonators, wherein:

the laterally coupled resonator has a first piezoelectric film portion, a first lower electrode and a plurality of upper electrodes, the first lower electrode and the plurality of upper electrodes sandwiching the first piezoelectric film portion;

each of the one or more series resonators and the one or more parallel resonators is a piezoelectric thin film resonator that has a second piezoelectric film portion, a second lower electrode and a second upper electrode, the second lower electrode and the second upper electrode sandwiching the second piezoelectric film portion;

a material of the first piezoelectric film portion is the same as a material of the second piezoelectric film portion;

a thickness of the first piezoelectric film portion is substantially the same as a thickness of the second piezoelectric film portion; and the one or more series resonators, the one or more parallel resonators and the laterally coupled resonator are formed on the single substrate.

9. The duplexer as claimed in claim 8, wherein a resonant frequency of the laterally coupled resonator is a frequency such that a phase of a pass band of an opposing filter of the laterally coupled resonator is inductive, the opposing filter being one of the transmit filter and the receive filter.

10. The duplexer as claimed in claim 8, wherein:

a material of the first lower electrode is the same as a material of the second lower electrode;

a thickness of the first lower electrode is substantially the same as a thickness of the second lower electrode;

a material of the plurality of first upper electrodes is the same as a material of the second upper electrode;

a thickness of the plurality of first upper electrodes is substantially the same as a thickness of the second upper electrode.

11. The duplexer as claimed in claim 8, wherein the first piezoelectric film portion and the second piezoelectric film portion form a single piezoelectric film.

12. A duplexer comprising:

a transmit filter that is connected between a common terminal and a transmit terminal;

a receive filter that is connected between the common terminal and a receive terminal; and a laterally coupled resonator that is connected between the transmit terminal and the receive terminal in parallel with the transmit filter and the receive filter, wherein at least one of the transmit filter and the receive filter is a filter that comprises:

a single substrate;

one or more series resonators that are connected in series between the common terminal and at least one of the transmit terminal and the receive terminal; and one or more parallel resonators that are connected in parallel between the common terminal and the at least one of the transmit terminal and the receive terminal, wherein:

the laterally coupled resonator has a first piezoelectric film portion, a first lower electrode and a plurality of upper electrodes, the first lower electrode and the plurality of upper electrodes sandwiching the first piezoelectric film portion;

each of the one or more series resonators and the one or more parallel resonators is a piezoelectric thin film resonator that has a second piezoelectric film portion, a second lower electrode and a second upper electrode, the second lower electrode and the second upper electrode sandwiching the second piezoelectric film portion;

a material of the first piezoelectric film portion is the same as a material of the second piezoelectric film portion;

a thickness of the first piezoelectric film portion is substantially the same as a thickness of the second piezoelectric film portion; and the one or more series resonators, the one or more parallel resonators and the laterally coupled resonator are formed on the single substrate.

13. The duplexer as claimed in claim 12, wherein:

a material of the first lower electrode is the same as a material of the second lower electrode;

a thickness of the first lower electrode is substantially the same as a thickness of the second lower electrode;

a material of the plurality of first upper electrodes is the same as a material of the second upper electrode;

a thickness of the plurality of first upper electrodes is substantially the same as a thickness of the second upper electrode.

14. The duplexer as claimed in claim 12, wherein the first piezoelectric film portion and the second piezoelectric film portion form a single piezoelectric film.

* * * * *